United States Patent
Kawagishi et al.

[11] Patent Number: 5,904,286
[45] Date of Patent: May 18, 1999

[54] CAPILLARY HOLDING STRUCTURE FOR AN ULTRASONIC HORN

[75] Inventors: Minoru Kawagishi, Kodaira; Mitsuaki Sakakura, Iruma; Tadashi Akiike, Kokubunji, all of Japan

[73] Assignee: Kabushiki Kaisha Shinkawa, Tokyo, Japan

[21] Appl. No.: 08/915,820

[22] Filed: Aug. 21, 1997

[30] Foreign Application Priority Data

Aug. 21, 1996 [JP] Japan ................... 8-238543

[51] Int. Cl.$^6$ .................. H01L 21/00; H01L 21/607
[52] U.S. Cl. ............................... 228/1.1; 228/55
[58] Field of Search ................... 228/1.1, 4.5, 55, 228/110.1, 180.5, 904; 156/73.2; 1/580.1

[56] References Cited

U.S. PATENT DOCUMENTS

| | | | |
|---|---|---|---|
| 5,368,216 | 11/1994 | Sakakura et al. | 228/1.1 |
| 5,469,011 | 11/1995 | Safabakhsh | 310/325 |
| 5,699,951 | 12/1997 | Miyoshi | 228/4.5 |
| 5,702,049 | 12/1997 | Biggs et al. | 228/4.5 |
| 5,829,663 | 11/1998 | Khelemsky et al. | 228/1.1 |

FOREIGN PATENT DOCUMENTS 6-163648  6/1994  Japan.
6-283578  10/1994  Japan.

Primary Examiner—Samuel M. Heinrich
Attorney, Agent, or Firm—Koda & Androlia

[57] ABSTRACT

An ultrasonic horn used in, for instance, wire bonding having a structure for holding a capillary therein, the capillary holding structure including an external screw section which protrudes from the end surface of the horn and a spacer mount which is larger in diameter than the external screw section and formed on the root portion of the external screw section. A ring-form spacer is mounted on the spacer mount, and the spacer has a shape that prevents the rotation of the spacer on the spacer mount and is formed so that its vertically opposing end portions are positioned above and below the capillary attachment hole, and the length between the horizontally opposing end portions of the spacer is shorter than the length of the vertically opposing end portions. In addition, a tightening member, such as a nut, is screwed on the external screw section so that a ring-form pressing part which is formed on the tightening member presses only against the vertically opposing end portions of the spacer, thus holding the capillary on the horn.

4 Claims, 6 Drawing Sheets

CAPILLARY HOLDING STRUCTURE FOR AN ULTRASONIC HORN

BACKGROUND OF THE INVENTION

1. Field of the Invention

The present invention relates to a capillary holding structure for an ultrasonic horn.

2. Prior Art

In a wire bonding apparatus, as universally known, an ultrasonic horn holds a capillary at one end thereof and is moved vertically and in the X and Y (or horizontal) directions so that a wire which passes through the capillary is connected between electrodes on semiconductor pellets and leads on lead frames.

Conventional structures for holding a capillary on ultrasonic horns are disclosed in, for instance, Japanese Patent Application Laid-Open (Kokai) Nos. H6-163648 and H6-283578. In these structures, a vertical split groove is formed in the tip end of the ultrasonic horn so that a capillary attachment hole has a bifurcated structure, and a screw is formed so as to be offset from the capillary attachment hole in a direction perpendicular to the direction of the split groove; and a capillary is held in the ultrasonic horn when a bolt on the screw is tightened and the split groove is bent.

Thus, the prior art capillary described above takes a split tightening structure; and the screw is offset from the capillary attachment hole, and the left and right portions of the ultrasonic horn (on both sides of the split groove) act as springs so as to hold the capillary in between. Accordingly, the holding of the capillary is not significantly stable. Moreover, the capillary is held by the bending of the split groove; in other words, the capillary is held at its side surfaces which are parallel to the direction of ultrasonic vibration (i.e., the axial direction of the ultrasonic horn); and holding of the capillary at its side surfaces, which are caused to vibrate in the direction of the ultrasonic waves, requires a large holding force.

SUMMARY OF THE INVENTION

Accordingly, the object of the present invention is to provide a capillary holding structure for an ultrasonic horn in which the capillary holding characteristics are improved and a superior capillary holding force is obtained.

The first means of the present invention for accomplishing the object is characterized by the fact that in a capillary holding structure for an ultrasonic horn in which a capillary is held in a capillary attachment hole formed in the tip end portion of the ultrasonic horn, the ultrasonic horn is formed with an external screw section, which protrudes from the tip end surface of the ultrasonic horn, and a spacer mount, which is formed on the root portion of the external screw section; and the horn is further provided with a ring-form spacer, which is mounted on the spacer mount, and a nut, which is screwed onto the external screw section; the spacer having a shape so that the space is not rotated when mounted on the spacer mount, the upper and lower portions of the spacer having a length so that the upper and lower portions are positioned above and below the capillary attachment hole, the left and right portions of the spacer has a length in the left-right direction which is shorter than the length between the upper and lower portions; and the nut being formed with a ring-form pressing part which presses only against the upper and lower portions of the spacer.

The second means of the present invention for accomplishing the object is characterized by the fact that in the first means described above, cut-out portions are formed by removing an upper portion and a lower portion of the ultrasonic horn so that the upper surface and undersurface on the tip end areas of such cut-out portions are used as upper-and-lower spacer positioning surfaces; spacer contact surfaces are formed on the left-side portion and right-side portion of the tip end surface of the ultrasonic horn so that the side surfaces of the spacer contact surfaces are used as left-and-right spacer positioning surfaces; such upper-and-lower spacer positioning surfaces and left-and-right spacer positioning surfaces are used as the spacer mount; in addition, the vertical length between the upper-and-lower spacer positioning surfaces and the left-right length between the left-and-right spacer positioning surfaces are formed unequal.

The third means of the present invention for accomplishing the object is characterized by the fact that in the first means described above, engaging parts which prevent the rotation of the spacer are formed on the outer circumferential portion of the spacer mount of the ultrasonic horn and in the inner circumferential portion of the spacer.

BRIEF DESCRIPTION OF THE DRAWINGS

FIG. 2 shows the capillary holding structure with a capillary installed therein, wherein

FIG. 3 shows the tip end of the ultrasonic horn, wherein

FIG. 4 shows the nut used in the present invention, wherein

FIG. 5 shows the spacer used in the present invention, wherein FIG. 5(a) is a front view, and FIG. 5(b) is a sectional view;

DETAILED DESCRIPTION OF THE INVENTION

Figure 1:
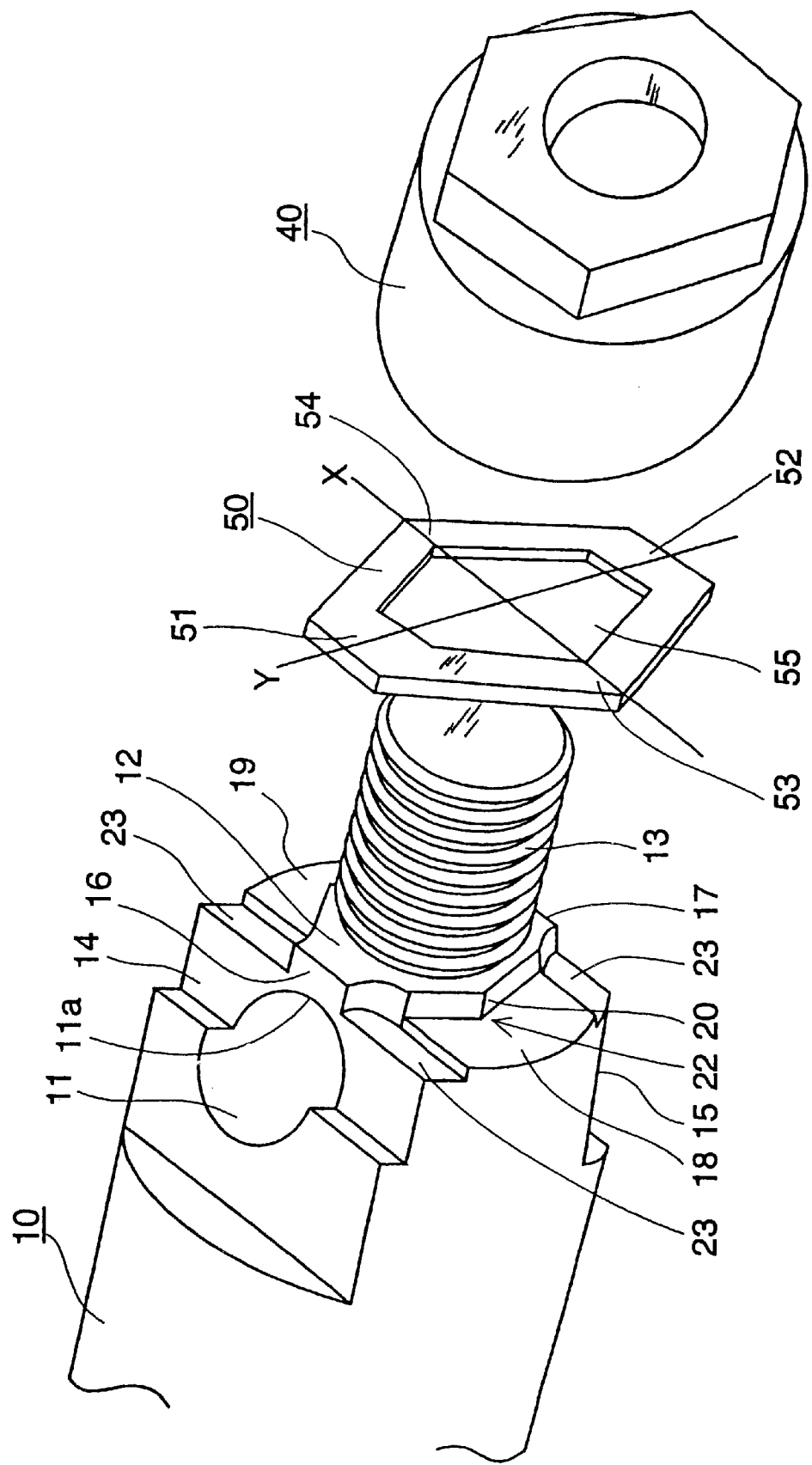
FIG. 1 is an exploded perspective view illustrating a first embodiment of the capillary holding structure for an ultrasonic horn according to the present invention.
Figure 2A:
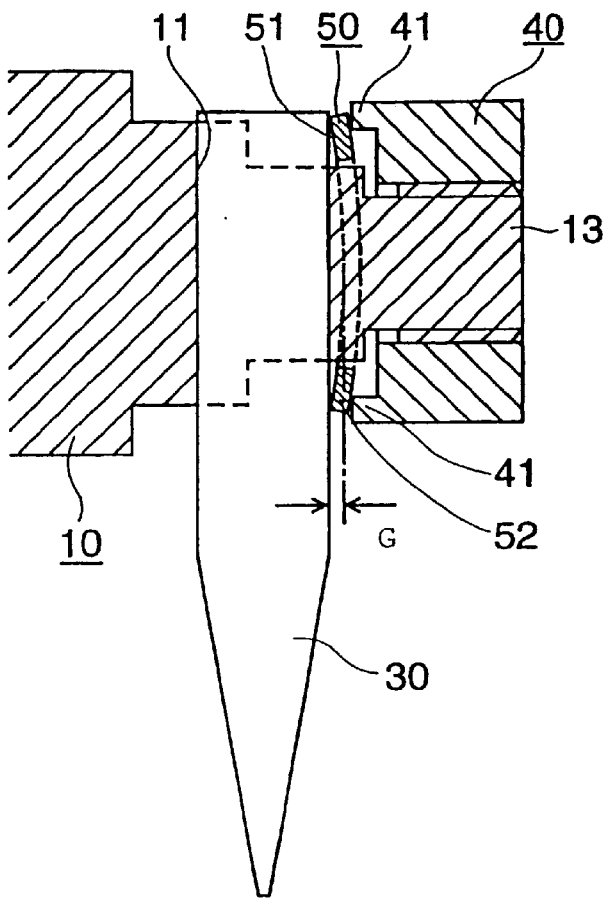
FIG. 2(a) is a longitudinal sectional front view.
Figure 2C:
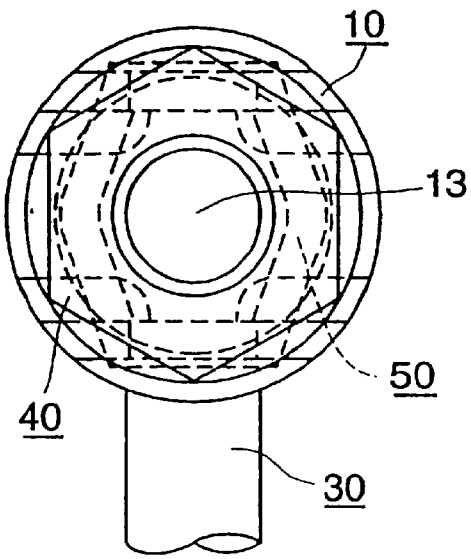
FIG. 2(c) is a right-side view of FIG. 2(a)
Figure 2B:
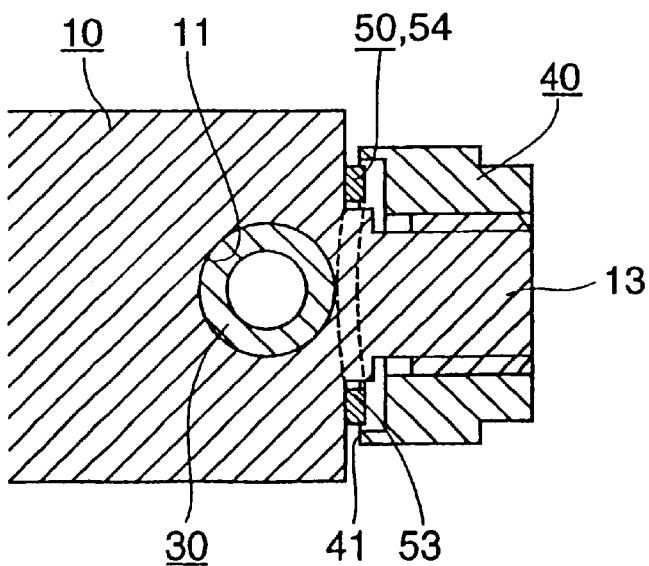
FIG. 2(b) is a cross-sectional plan view.

A first embodiment of the present invention is illustrated in FIGS. 1 through 7, and as shown in FIGS. 1 and 2, the capillary holding structure for the ultrasonic horn is constructed from an ultrasonic horn 10, a nut 40 and a spacer 50 so as to hold a capillary 30.

Figure 3A:
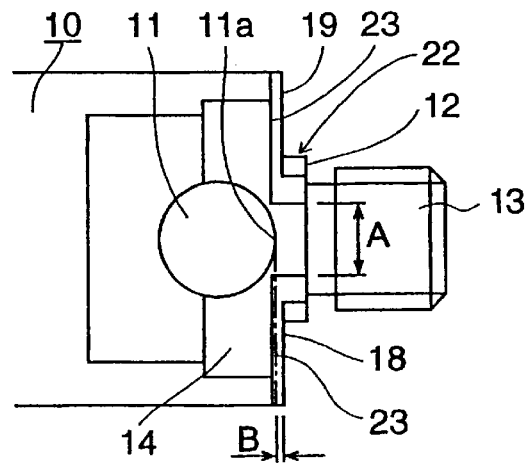
FIG. 3(a) is a top view.
Figure 3B:
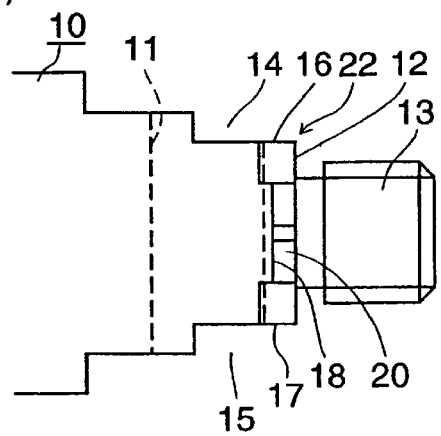
FIG. 3(b) is a front view.
Figure 3C:
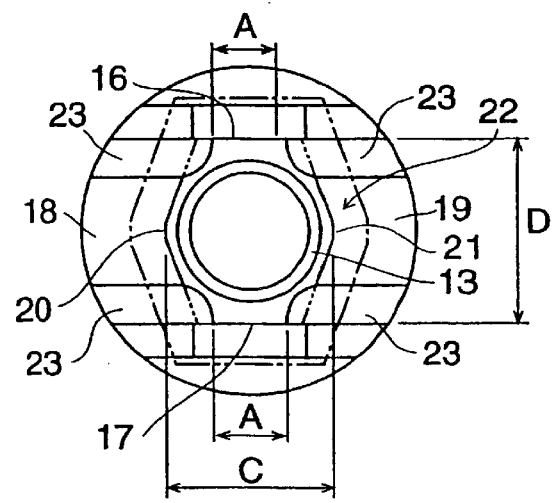
FIG. 3(c) is a right-side view of FIG. 3(b)
Figure 4A:
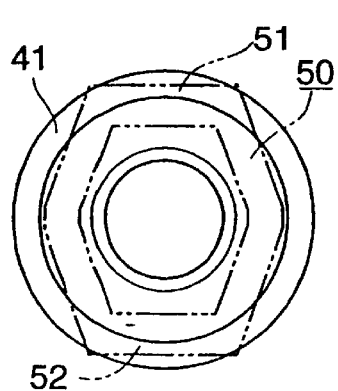
FIG. 4(a) is a left-side view.
Figure 4B:
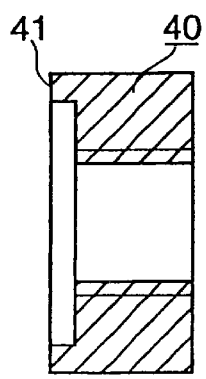
FIG. 4(b) is a sectional view.
Figure 4C:
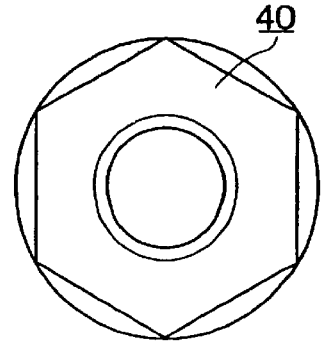
FIG. 4(c) is a right-side view with reference to FIG. 1.
Figure 5:
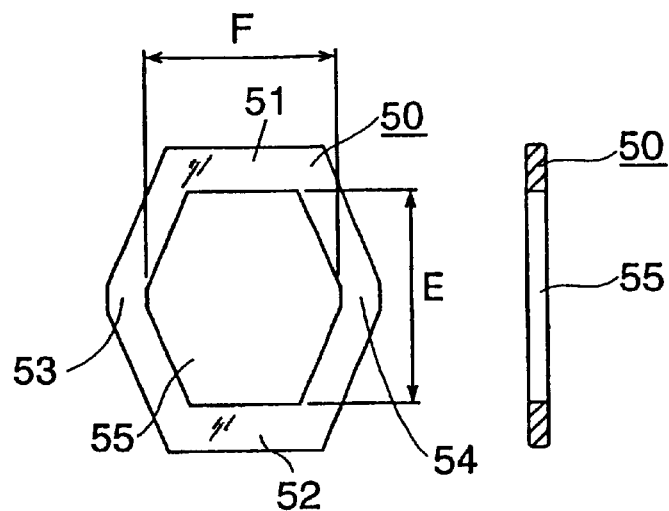
Figure 6:
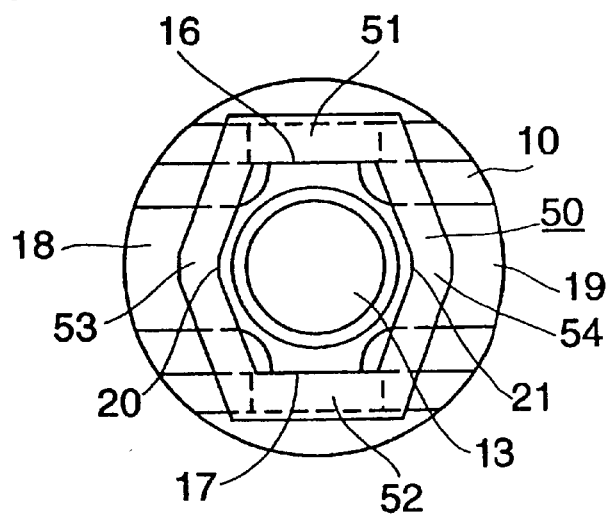
FIG. 6 illustrates the relationship between the ultrasonic horn and the spacer.
Figure 7:
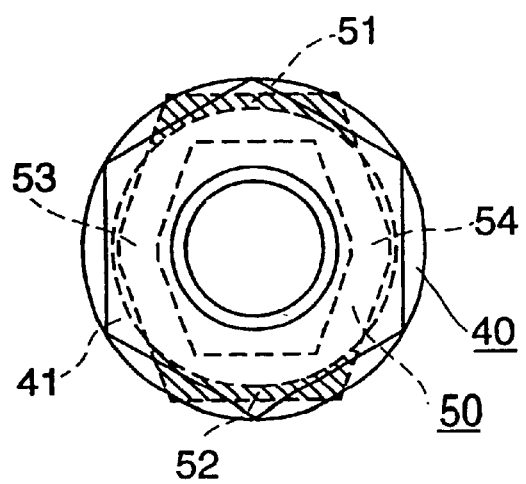
FIG. 7 illustrates the relationship between the spacer and the nut.

In FIGS. 1 through 3, a capillary attachment hole 11 which holds the capillary 30 is formed vertically through the tip end portion of the ultrasonic horn 10 (in other words, the attachment hole 11 is formed so as to extend in a direction perpendicular to the length of the ultrasonic horn 10), and an external screw section 13 is formed on the tip end surface 12 of the ultrasonic horn 10 so that the screw section 13 protrudes from the end surface 12.

In the upper and lower portions of the tip end surface 12, cut-out portions 14 and 15 are formed by removing the tip end surface sides of the tip end portion of the horn 10 which is defined by a fixed width of A and by substantially semicircular portions on the tip end surface side of the capillary attachment hole 11. The upper surface and undersurface on the tip end surface sides of these cut-out portions 14 and 15 act as upper-and-lower spacer positioning surfaces 16 and 17 for the spacer 50.

Spacer contact parts 18 and 19 which are contacted by the spacer 50 are formed on the left-side and right-side portions of the tip end surface 12 with a thickness of B being left from the tip end portion 11a of the capillary attachment hole 11. The side surfaces adjacent to the spacer contact surfaces 18 and 19 are formed in a peak shape and act as left-and-right spacer positioning surfaces 20 and 21 for the spacer 50.

Thus, the upper-and-lower spacer positioning surfaces 16 and 17 and the left-and-right spacer positioning surfaces 20 and 21 formed on the root portion of the external screw section 13 constitute a spacer mount 22.

The left-right length C between the left-and-right spacer positioning surfaces 20 and 21 is set so as to be shorter than the vertical length D between the upper-and-lower spacer positioning surfaces 20 and 21. This is done in order to insure that a pressing part 41 of the nut 40 acts only on the upper portion 51 and lower portion 52 of the spacer 50 and not on the left portion 53 or right portion 54 of the spacer 50, when the spacer 50 is mounted on the spacer mount 22 (which is defined by the upper-and-lower spacer positioning surfaces 16 and 17 and left-and-right spacer positioning surfaces 20 and 21) and is tightened down by screwing the nut 40 onto the external screw section 13.

The areas between the upper-and-lower spacer positioning surfaces 16 and 17 and the left-and-right spacer positioning surfaces 20 and 21 are formed as relief surfaces 23.

As shown in FIGS. 2(a), 2(b), 4(a), 4(b) and 7, a pressing part 41 is formed on the nut 40 which is screwed onto the external screw section 13. The pressing part 41 is in the form of a ring and protrudes from one side surface of the nut 40 so as to apply a pressing force to the upper portion 51 and lower portion 52 of the spacer 50.

As seen from FIGS. 1, 2, 5 and 6, the spacer 50 is substantially a ring with a polygonal shape (irregular shape). The internal diameter of the hole 55 formed in the spacer 50 is of a size which allows the spacer 50 to be mounted on the upper-and-lower spacer positioning surfaces 16 and 17 and left-and-right spacer positioning surfaces 20 and 21 of the ultrasonic horn 10. In other words, the internal diameter E (see FIG. 5) of the hole 55 between the upper portion 51 and lower portion 52 of the spacer 50 is the same as, or slightly larger than, the length between the upper-and-lower spacer positioning surfaces 16 and 17, while the internal diameter F between the left portion 53 and right portion 54 is the same as, or slightly larger than, the length between the left-and-right spacer positioning surfaces 20 and 21.

The upper portion 51 and lower portion 52 of the spacer 50 form pressing surfaces upon which the pressing part 41 of the nut 40 acts, while the left portion 53 and right portion 54 are formed in such a size that the ring-shaped pressing part 41 of the nut 40 does not come in contact thereto and does not act on the left and right portions 53 and 54.

With the structure described above, the spacer 50 is first mounted, by way of its hole 55, on the upper-and-lower spacer positioning surfaces 16 and 17 and left and right positioning surfaces 20 and 21 of the ultrasonic horn 10. In this case, the positioning of the upper portion 51 and lower portion 52 of the spacer 50 in the vertical direction is made by the upper-and-lower spacer positioning surfaces 16 and 17 of the ultrasonic horn 10, and the positioning of the left portion 53 and right portion 54 of the spacer 50 in the left-right direction is made by the left-and-right spacer positioning surfaces 20 and 21 of the ultrasonic horn 10.

Next, the spacer 50 is tightened down by screwing the nut 40 onto the external screw section 13. As a result, the ring-shaped pressing part 41 of the nut 40 presses against the upper portion 51 and lower portion 52 of the spacer 50 as indicated by the shaded areas in FIG. 7, so that the spacer 50 bends (see FIG. 2(a)) outwardly after the left portion 53 and right portion 54 of the spacer 50 contact the spacer contact surfaces 18 and 19 of the ultrasonic horn 10. Afterward, the spacer 50 bends by an amount equal to the step G (see FIG. 2(a)) in the ultrasonic horn 10, so that the upper portion 51 and lower portion 52 of the spacer 50 press against the upper and lower portions of the capillary 30 and thus hold the capillary 30. In other words, the required tightening force of the nut 40 is obtained from the bending force of the spacer 50 plus the holding force of the capillary 30.

Since the spacer 50 is deformed by the nut 40 and holds the capillary 30 by pressing against the capillary 30, the capillary is held more securely than in a conventional split tightening system. In addition, since the capillary 30 is held by its upper and lower portions (two points) which are perpendicular to the direction of ultrasonic vibration (which is in an axial direction of the ultrasonic horn 10), the secure holding of the capillary is further enhanced in this regard.

Furthermore, the length between the upper-and-lower spacer positioning surfaces 16 and 17 of the ultrasonic horn 10 differs from the length between the left-and-right spacer positioning surfaces 20 and 21, and the hole 55 in the spacer 50 is formed with an irregular shape so that the spacer 55 is restrained from being rotated when it is mounted on the spacer mount 22 (which is defined by the upper-and-lower spacer positioning surfaces 16 and 17 and left-and-right spacer positioning surfaces 20 and 21 ); accordingly, the spacer 50 is not rotated even if the nut 40 is turned; and the spacer 50 can always hold the capillary 30 in position at the same place. Thus, the holding of the capillary 30 is stable.

The spacer 50 may have spring properties or may lack such spring properties. However, if the spacer 50 is made from a ductile material which has a low hardness and no spring properties, a recess that matches the diameter of the capillary 30 can be formed in the spacer 50 when the nut 40 is tightened several times; as a result, the capillary 30 is held more tightly by the spacer 50, and the holding of the capillary is further stabilized. On the other hand, if the spacer 50 has spring properties, the rebound force that arises from the springiness of the spacer 50 can prevent loosening of the nut 40; however, the tightness between the spacer 50 and the capillary 30 could be inferior compared to the use of a spacer which has no spring properties.

Furthermore, the nut 40 holds the capillary 30 with the spacer 50 in between; as a result, only the spacer 50, which is customarily inexpensive, is worn by the tightening action of the nut 40, and no wear occurs at the tip end portion of the expensive ultrasonic horn 10. Moreover, since the tightening force of the nut 40 bends the spacer 50 and this force is not applied directly to the capillary 30, the nut 40 can be firmly tightened without damaging the capillary 40, and it is possible to prevent the nut 40 from loosening. Furthermore, since there is no thin portion in the side wall of the capillary attachment hole 11 which can be deformed by the tightening of the nut 40, the capillary attachment hole 11 is not deformed even if the nut 40 is tightened without inserting the capillary 30 in the capillary attachment hole 11. Thus, damage to the expensive ultrasonic horn 10 can be prevented.

Figure 8:
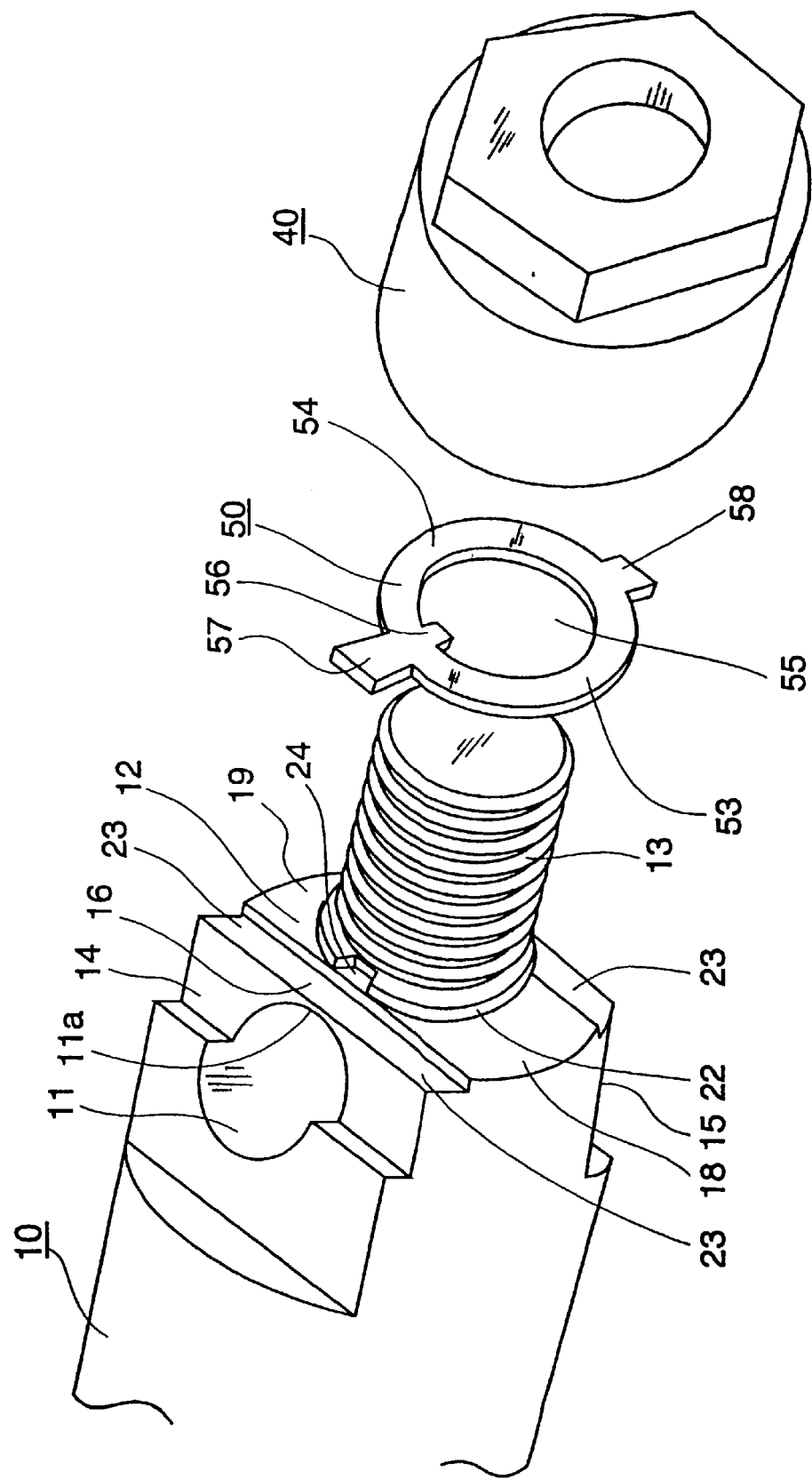
FIG. 8 is an exploded perspective view illustrating a second embodiment of the capillary holding structure for an ultrasonic horn according to the present invention.

FIG. 8 shows a second embodiment of the present invention. Elements which are the same as in the first embodiment or correspond to those are labeled with the same symbols, and a description of such elements is omitted.

In the second embodiment, the shapes of the spacer 50 and the spacer mount 22 of the ultrasonic horn 10 differ from those in the first embodiment. More specifically, the spacer mount 22 is substantially circular, and an engagement groove 24 is formed in the upper portion of the spacer mount 22. The spacer 50 is substantially a circular ring having an internal diameter that allows the spacer 50 to be mounted on the spacer mount 22.

In particular, an engaging projection 56 which engages with the engagement groove 24 of the spacer mount 22 is formed so as to project into the hole 55 of the spacer 50. An upper part 57 and lower part 58, which are positioned above and below the capillary attachment hole 11 when the spacer 50 is mounted on the spacer mount 22 and the engaging projection 56 is engaged with the engagement groove 24, are formed on the upper and lower portions of the spacer 50. In addition, the left-right length between the left portion 53 and right portion 54 of the spacer 50 is set so as to be shorter than the length between the upper part 57 and lower part 58, so that the pressing part 41 of the nut 40 presses only against the upper part 57 and lower part 58 of the spacer 50.

Accordingly, the spacer 50 is mounted on the spacer mount 22 with the engaging projection 56 of the spacer 50 engaged with the engagement groove 24 of the horn 10. Then, the nut 40 is screwed onto the external screw section 13 and tightened down. As a result, the ring-shape pressing part 41 of the nut 40 presses against the upper part 57 and lower part 58 of the spacer. After the left portion 53 and right portion 54 of the spacer 50 contact the spacer contact surfaces 18 and 19, the upper part 57 and lower part 58 of the spacer 50 are bent by being pressed by the pressing part 41 of the nut 40; as a result, the upper part 57 and lower part 58 press against upper and lower portions of the capillary (not shown) in the capillary attachment hole 11, thus holding the capillary therein. In other words, in the present embodiment, since the engaging projection 56 engages with the engagement groove 24, the spacer 50 is not rotated even if the nut 40 is turned. Thus, the position of the spacer 50 is stabilized. Other advantages are the same as in the first embodiment.

Figure 9:
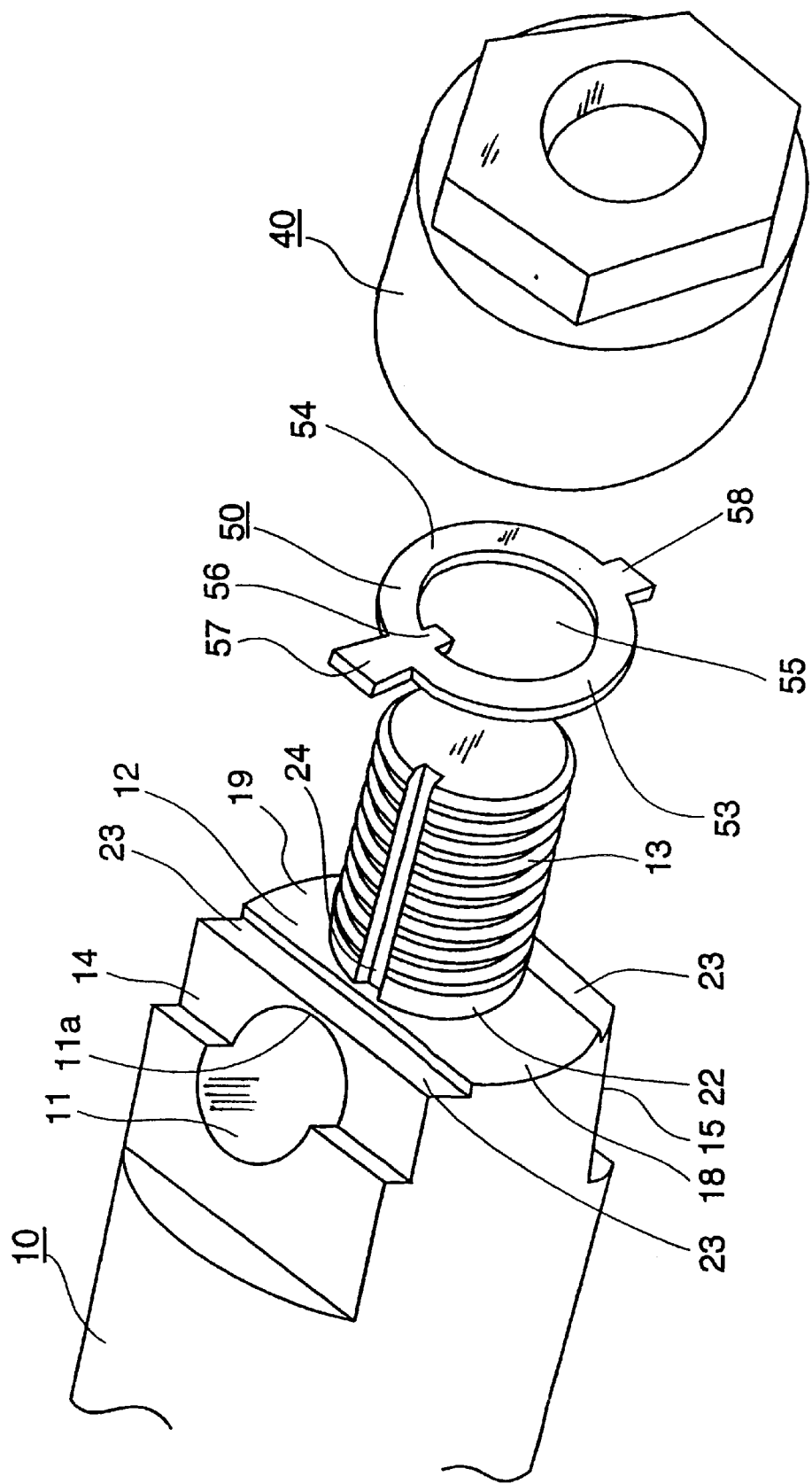
FIG. 9 is an exploded perspective view illustrating a third embodiment of the capillary holding structure for an ultrasonic horn according to the present invention.

FIG. 9 illustrates a third embodiment of the present invention. In the second embodiment shown in FIG. 8, the spacer mount 22 is formed so as to be larger than the external screw section 13. In this third embodiment, on the other hand, the spacer mount 22 is formed so as to have the same outer diameter as the external screw section 13, and the engagement groove 24 is formed so as to extend for the length of the external screw section 13. Thus, the spacer 50 is mounted on the spacer mount 22 by being slid from the tip end of the external screw section 13 after having the engaging projection 56 engaged with the engagement groove 24.

The positions of the engagement groove 24 and engaging projection 56 are not limited so as to be on the upper portions of the respective parts as shown in FIGS. 8 and 9; and instead, the engagement groove 24 and engaging projecting 56 may be formed in any desired locations on the outer diameter of the spacer mount 22 and on the inner diameter of the spacer 50. In addition, since the engaging projection 56 and the engagement groove 24 are in a projection-recess engagement relationship, it would also be possible to form an engaging projection on the spacer mount 22 and an engagement groove in the spacer 50.

As seen from the above, according to the present invention, the capillary is held in the ultrasonic horn by being pressed by the tightening force of a nut with a spacer in between. Accordingly, the capillary is held more securely than in a conventional split tightening system. Furthermore, since the portions of the side wall of the capillary attachment hole which hold the capillary are upper and lower portions of a vertical side wall oriented perpendicular to the direction of ultrasonic vibration, a securely holding of the capillary is enhanced in this regard. In addition, since the capillary is thus held more securely, irregularities in the vibration of the ultrasonic horn caused by ultrasonic oscillation are eliminated, and a stable vibration can be transmitted to the capillary.

Furthermore, since the spacer has a shape so as not to be rotated when it is mounted on the spacer mount of the ultrasonic horn, the spacer will not rotate even if the nut is turned. Accordingly, the capillary can always be held in the same place, and the holding of the capillary is stable. In addition, if the spacer is made from a ductile material which has a low hardness, a recess which matches the outer diameter of the capillary can be formed in the spacer when the nut is tightened; as a result, an increased tight pressing of the capillary by the spacer is assured, thus farther stabilizing the holding of the capillary. In addition, since the nut holds the capillary with the spacer in between, no wear occurs in the ultrasonic horn, and the nut can be firmly tightened without damaging the capillary, and loosening of the nut is prevented. Moreover, the side wall of the capillary attachment hole is not deformed when the capillary is held; thus, the capillary attachment hole is not deformed, and damage to the ultrasonic horn can be prevented.

We claim:

1. A capillary holding structure in which a capillary is held in a capillary attachment hole formed in a tip end portion of said ultrasonic horn, said structure being characterized in that:

said ultrasonic horn is formed with an external screw section protruding from a tip end surface of said ultrasonic horn and a spacer mount being formed on a root portion of said external screw section, and said ultrasonic horn is further provided with a ring-form spacer adapted so as to be mounted on said spacer mount and a nut adapted so as to be screwed onto said external screw section;

said spacer having a shape so as to be prevented from rotating when mounted on said spacer mount, a length in a vertical direction between upper and lower portions of said spacer being formed so that said upper and lower portions are positioned above and below said capillary attachment hole, and a length in a left-right direction between left and right portions of said spacer being set so as to be shorter than said length in a vertical direction between said upper and lower portions; and said nut being formed with a ring-form pressing part which presses only against said upper and lower portions of said spacer.

2. A capillary holding structure for an ultrasonic horn according to claim 1, wherein said spacer mount comprises upper-and-lower spacer positioning surfaces and left-and-right spacer positioning surfaces:

said upper-and-lower spacer positioning surfaces being defined by an upper surface and an under surface which are on tip end areas of cut-out portions which are obtained by removing an upper portion and a lower portion of said ultrasonic horn, said left-and-right spacer positioning surfaces being defined by spacer contact surfaces which are formed on a left-side portion and a right-side portion of said tip end surface of said ultrasonic horn; and a vertical length between said upper-and-lower spacer positioning surfaces and a left-right length between said left-and-right spacer positioning surfaces are formed unequal.

3. A capillary holding structure for an ultrasonic horn according to claim 1, further comprising engaging parts which prevent a rotation of said spacer, said engaging parts being formed on an outer circumferential portion of said spacer mount of said ultrasonic horn and in an inner circumferential portion of said spacer.

4. An ultrasonic horn for holding a capillary in a capillary attachment hole formed in said horn so as to extend in a direction perpendicular to a length of said ultrasonic horn, said ultrasonic horn comprising:

an external screw section protruding from an end surface of said ultrasonic horn;

a spacer mount formed on a root portion of said external screw section;

a spacer adapted so as to be mounted on said spacer mount in an unrotatable fashion on said spacer mount; and a tightening means adapted so as to be screwed onto said external screw section, said tightening means having a pressing part which comes into contact with and bends said spacer so that said spacer presses a plurality of points on said capillary installed in said capillary attachment hole, said plurality of points being parallel to an axis of said capillary.

\* \* \* \* \*